(12) United States Patent
Kawana et al.

(10) Patent No.: US 10,316,500 B2
(45) Date of Patent: Jun. 11, 2019

(54) TOUCH DETECTION DEVICE FOR WATER HANDLING EQUIPMENT, AND FAUCET APPARATUS INCLUDING THE SAME

(71) Applicant: TOTO LTD., Kitakyushu-shi, Fukuoka (JP)

(72) Inventors: Kohei Kawana, Kitakyushu (JP); Makoto Hatakeyama, Kitakyushu (JP); Masashi Hara, Kitakyushu (JP); Hideyuki Matsui, Kitakyushu (JP)

(73) Assignee: TOTO LTD., Kitakyushu-Shi, Fukuoka (JP)

( * ) Notice: Subject to any disclaimer, the term of this patent is extended or adjusted under 35 U.S.C. 154(b) by 0 days.

(21) Appl. No.: 15/714,810

(22) Filed: Sep. 25, 2017

(65) Prior Publication Data

US 2018/0106024 A1    Apr. 19, 2018

(30) Foreign Application Priority Data

Oct. 13, 2016    (JP) .................................. 2016-201941

(51) Int. Cl.
*E03C 1/05*    (2006.01)
*H03K 17/96*   (2006.01)
*F16K 27/00*   (2006.01)

(52) U.S. Cl.
CPC .............. *E03C 1/055* (2013.01); *F16K 27/00* (2013.01); *H03K 17/96* (2013.01)

(58) Field of Classification Search
CPC ...... E03C 1/055; H03K 17/96; H03K 17/964; F16K 27/00
See application file for complete search history.

(56) References Cited

U.S. PATENT DOCUMENTS

| | | | | |
|---|---|---|---|---|
| 4,012,649 | A * | 3/1977 | Cook ..................... | G08B 13/10 310/330 |
| 4,174,563 | A * | 11/1979 | Simpson ................ | H01R 4/723 174/90 |
| 5,053,671 | A * | 10/1991 | Kobayashi .......... | G01P 15/0922 310/324 |
| 5,573,077 | A * | 11/1996 | Knowles ............... | G06F 3/0436 178/18.04 |
| 5,673,041 | A * | 9/1997 | Chatigny ............... | H03K 17/94 178/18.04 |
| 6,275,448 | B1 * | 8/2001 | Kittower ................. | H04R 1/44 367/155 |
| 10,019,119 | B2 * | 7/2018 | Rebeschi ............ | G06F 3/03545 |

(Continued)

*Primary Examiner* — Matthew W Jellett
(74) *Attorney, Agent, or Firm* — Baker & Hostetler LLP

(57) ABSTRACT

A touch detection device has a sensing unit that includes a contact portion which comes into contact with an object, a vibration excitation element that vibrates the contact portion, a detection circuit that includes a drive circuit and a contact determination circuit, and an electrical wire that connects the vibration excitation element and the detection circuit, and is covered with a covering material. The vibration excitation element is covered with a potting layer made of resin through a predetermined internal space. While being inserted into the potting layer, the electrical wire has an end connected to the vibration excitation element, and an insertion portion inserted into the potting layer includes a non-covering portion formed by peeling of the covering material.

6 Claims, 7 Drawing Sheets

(56) References Cited

U.S. PATENT DOCUMENTS

| | | | |
|---|---|---|---|
| 2006/0006354 A1* | 1/2006 | Guler | E03C 1/057 251/129.04 |
| 2007/0069169 A1* | 3/2007 | Lin | E03C 1/0404 251/129.04 |
| 2014/0352799 A1* | 12/2014 | Rosko | C02F 1/78 137/237 |
| 2016/0032571 A1* | 2/2016 | Jepson | G05D 7/0635 137/551 |
| 2017/0003253 A1* | 1/2017 | Kaneko | H03K 17/96 |

* cited by examiner

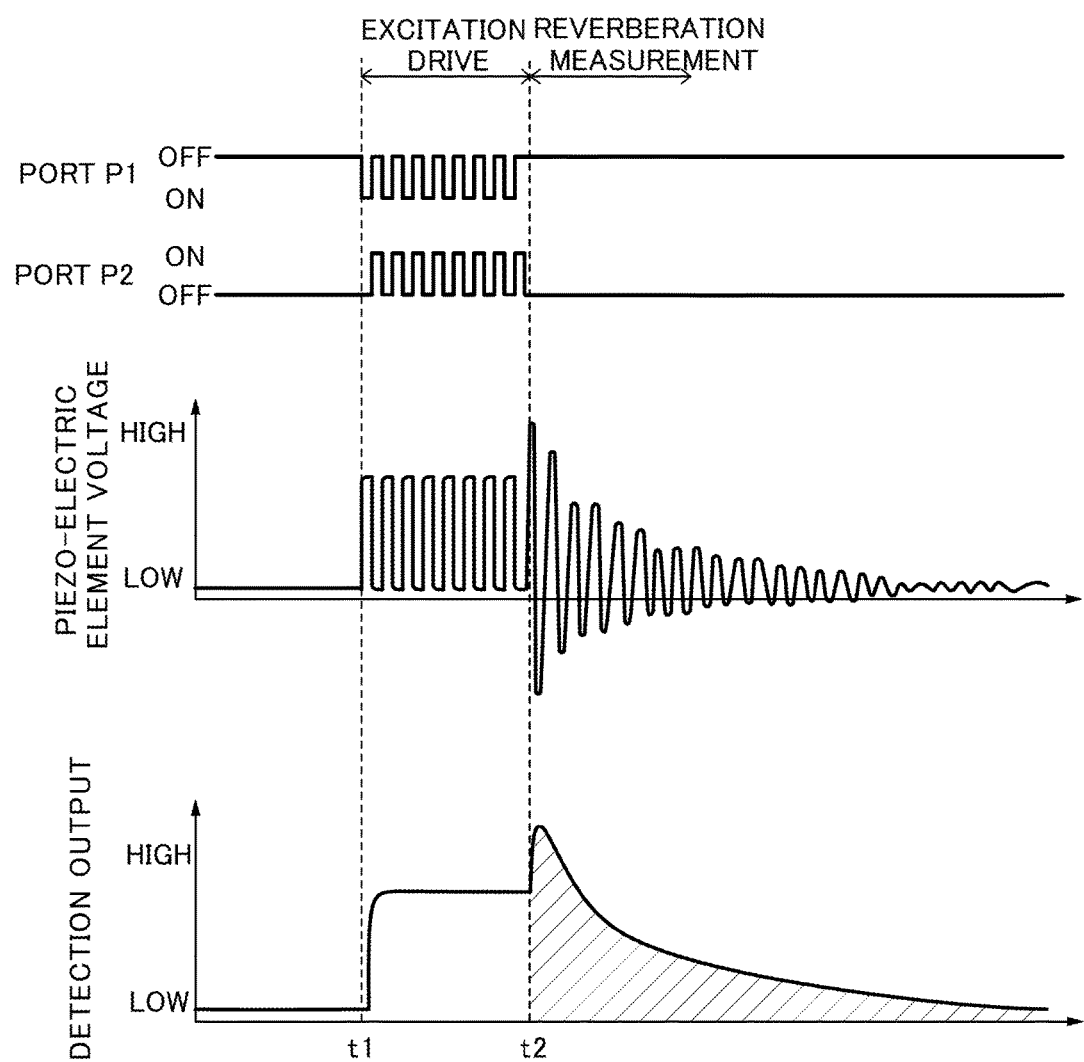

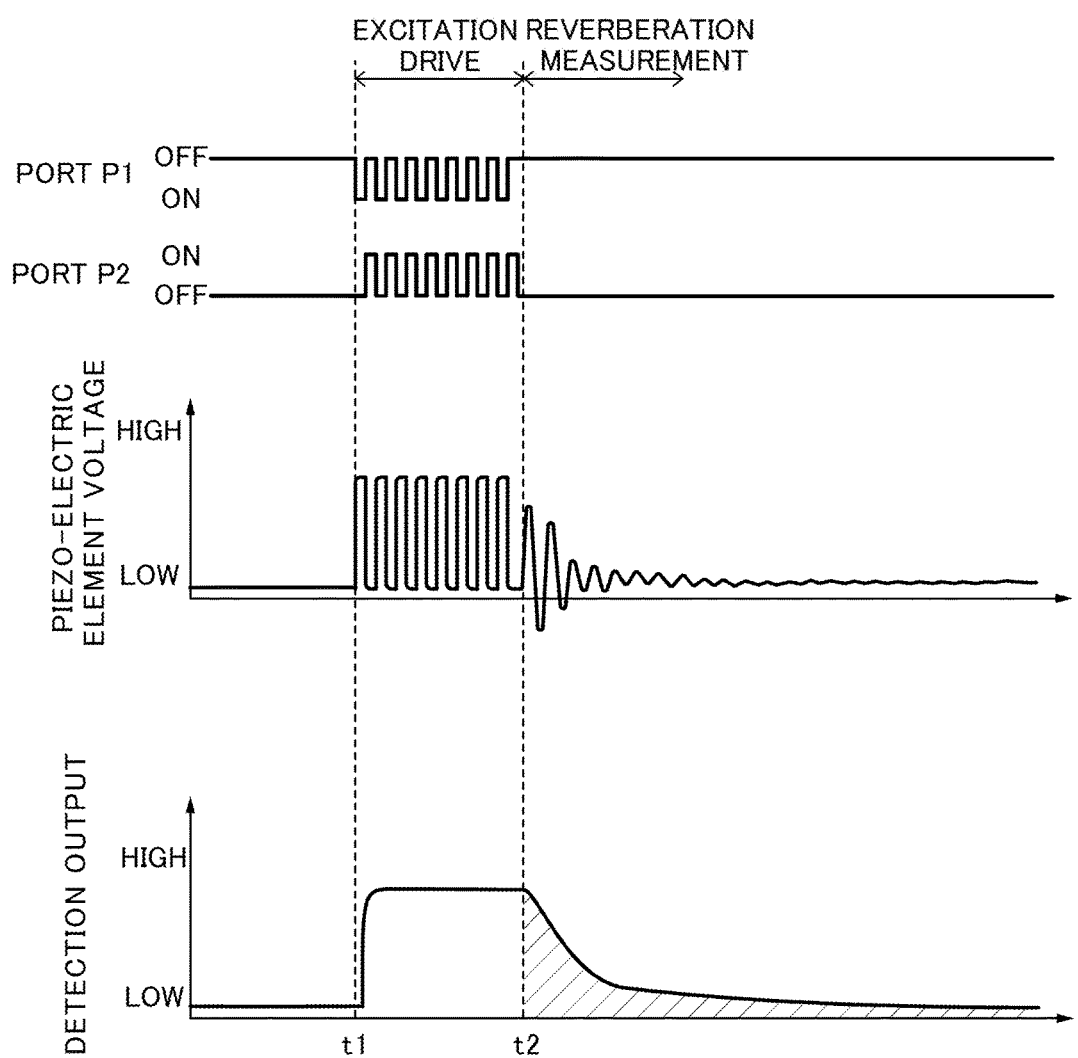

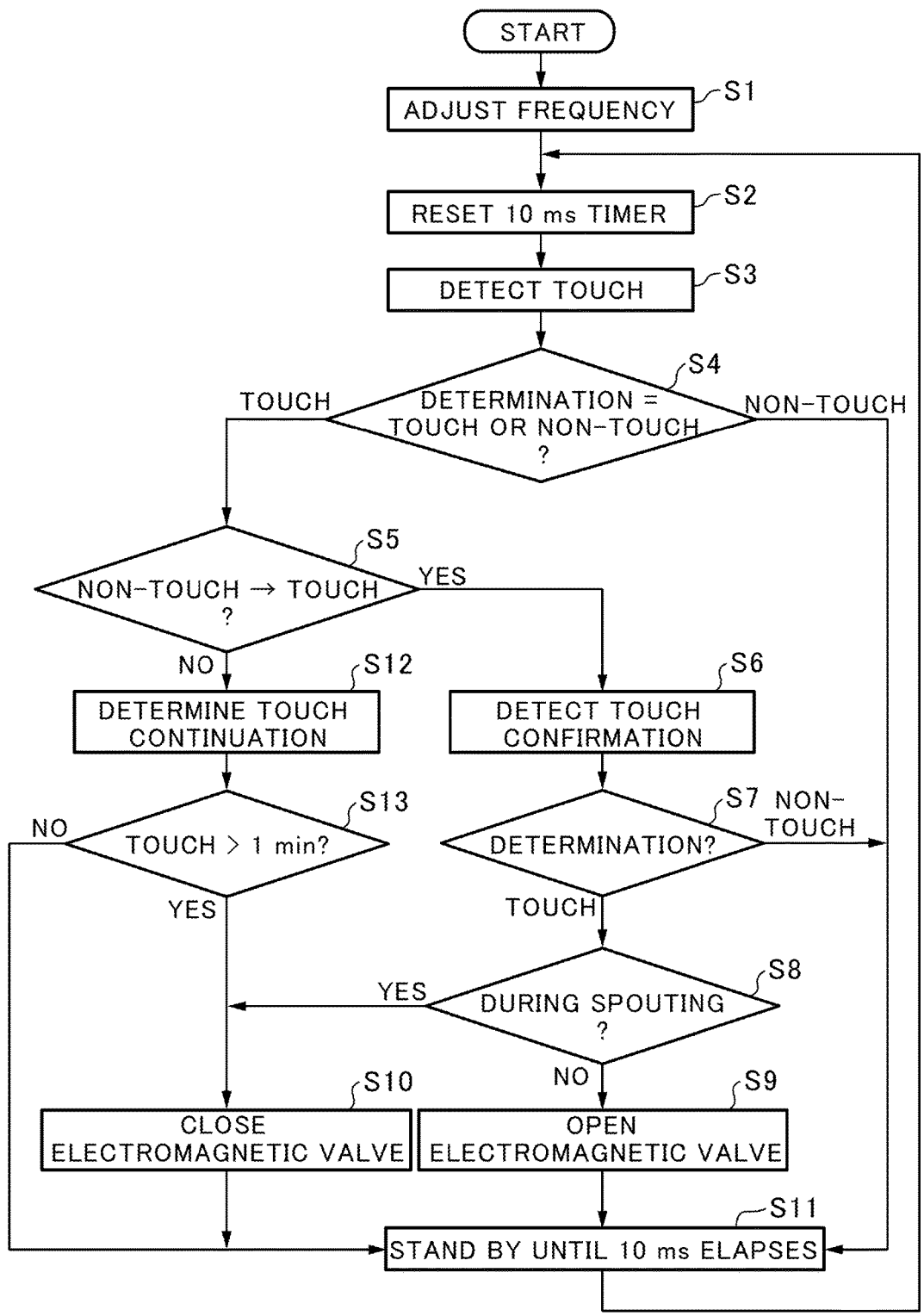

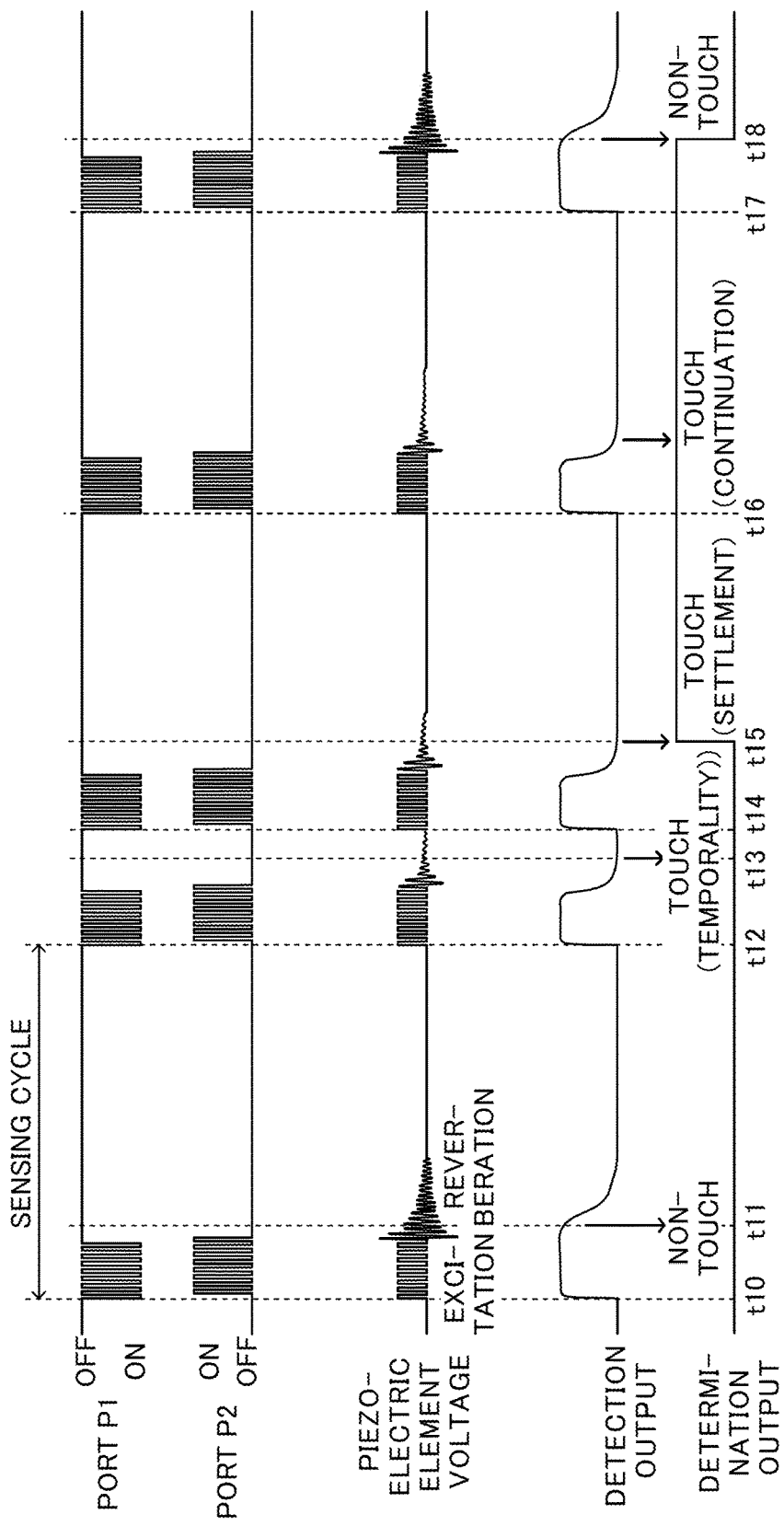

TOUCH DETECTION DEVICE FOR WATER HANDLING EQUIPMENT, AND FAUCET APPARATUS INCLUDING THE SAME

TECHNICAL FIELD

The present invention relates to a touch detection device, and particularly to a touch detection device for water handling equipment, and a faucet apparatus including the same.

BACKGROUND

Water handling equipment capable of detecting operation by a user by utilizing a switch or a sensor, and switching between spouting and water stop or changing a spouting form on the basis of the detected operation begins to spread. Such water handling equipment such as faucet apparatuses used in a water section such as a kitchen, a washroom, a toilet and a bathroom are used in environment where water wetting is likely to be caused, are extremely heavily-used, and are required to have a long term usability life. Therefore, a switch or a sensor for detecting operation desirably does not have a mechanical electrical contact.

A photoelectric sensor utilized in an automatic faucet or the like has an advantage that operation can be performed in a non-contact state. However, a sensing unit is stood out, and therefore it cannot be said that designability is excellent. Furthermore, the photoelectric sensor has a problem in that when water or bubbles are attached to the sensing unit, malfunction is caused.

Additionally, although an electrostatic sensor can be operated by a very light touch, in the environment where water wetting is likely to be caused, malfunction cannot be avoided, and the electrostatic sensor is difficult to be utilized in the water handling equipment.

Furthermore, faucet parts being conductors require insulation by resin or the like, and it cannot be said that designability is excellent.

Herein, for example, Patent Document 1 (Japanese Patent Unexamined Publication No. 54-153284) describes a piezoelectric switch. This piezoelectric switch is a switch that utilizes a piezo-electric element, and can detect pressing operation of a user without utilizing a mechanical electrical contact.

Patent Document 2 (Japanese Patent Unexamined Publication No. 58-40803) describes a contactless push button switching circuit. Also in this push button switch, a piezo-electric element is utilized, and pressing operation by a user is detected without using a mechanical electrical contact.

However, in the piezoelectric switch described in the above Patent Document 1, pressing force applied to the piezo-electric element is used to cause elastic deformation, and switch operation is detected by means of charges generated on the basis of this elastic deformation. Therefore there is a problem in that relatively large operating force is needed in order to operate switch, and operation cannot be performed by a light touch.

In the contactless push button switching circuit described in Patent Document 2, the piezo-electric element is incorporated in an oscillation circuit, and pressing operation by a user is detected by utilizing lowering or stop of oscillation due to change in electrical characteristics such as impedance of the piezo-electric element caused by pressing force applied to this piezo-electric element. In this contactless push button switching circuit, even slight pressing force to the piezo-electric element causes change in the electrical characteristics, and an oscillation state of the oscillation circuit incorporated in the piezo-electric element is changed, and therefore operation can be detected even with a light touch.

However, the oscillation state of the oscillation circuit is extremely sensitive to a circuit constant, and therefore there is a problem in that when the piezo-electric element for detecting operation is installed at a place away from an oscillation circuit body, the oscillation state becomes unstable, and misdetection is likely to occur.

For example, in a case where only the piezo-electric element incorporated in the oscillation circuit is disposed in the vicinity of a spouting portion of a faucet apparatus, other part (oscillation circuit body) of the oscillation circuit is disposed on a lower side of a counter board where the faucet apparatus is installed, a lead wire that connects the piezo-electric element and the oscillation circuit body becomes relatively long. Therefore, inductance or a stray capacitance component of this lead wire sometimes makes operation of the oscillation circuit unstable to cause malfunction. In order to prevent such malfunction, the piezo-electric element needs to be disposed in the vicinity of the oscillation circuit body. In this case, for example, the whole of the oscillation circuit needs to be incorporated in the vicinity of the spouting portion in order to dispose an operating unit in the vicinity of the spouting portion of the faucet apparatus, and the degree of freedom of the design of the faucet apparatus is largely restricted.

The present inventors utilize an ultrasonic element, which has been utilized to detect an object located at a distance to some extent, as a touch sensor in order to enable operation by a light touch and to implement prevention of malfunction even in a case of use in water handling equipment, and focuses detection of reverberation or damping of vibration when contact portion is touched during touch operation.

In a touch detection device utilizing such an ultrasonic element as a touch sensor, the ultrasonic element as a vibration excitation element needs to be electrically connected by an electrical wire, and therefore potting by resin or the like is needed in order to utilize the touch detection device in a water section.

However, when the ultrasonic element is directly potted, the ultrasonic element cannot be vibrated, and therefore a problem is that the ultrasonic element needs to be potted while a space enabling vibration is secured.

Furthermore, in a case where such an ultrasonic element is incorporated in water handling equipment, even when the ultrasonic element is potted with a potting layer while the space enabling vibration is secured, there is a problem in that a temperature difference or an air pressure difference between an internal space on a side close to the ultrasonic element with respect to the potting layer and an external space of the potting layer is likely to be caused by a using situation of hot water or water of the water handling equipment, or temperature change due to an ambient environment.

Therefore, there is a problem in that, for example, gas containing vapor in the external space of the potting layer comes through an electrical wire to be drawn in the internal space on the side close to the ultrasonic element by the air pressure difference between the inner and outer spaces with such a potting layer therebetween, and the ultrasonic element is exposed to moisture, and functionality may be lowered.

SUMMARY

The present invention has been made in order to solve the above problems of the conventional technologies, and an object of the present invention is to provide a touch detection device used in water handling equipment, which is capable of preventing a vibration excitation element from coming into a state of being exposed to moisture and water droplets, and is capable of preventing lowering of functionality of the vibration excitation element, and a faucet apparatus including the same.

In order to solve the above problem, the present invention is a touch detection device for water handling equipment, the touch detection device comprising: a sensing unit including a contact portion configured to come into contact with an object, and the sensing unit being configured to sense contact of the object with the contact portion; a vibration excitation element configured to vibrate the contact portion; and a detection circuit including a drive circuit and a contact determination circuit, the drive circuit being configured to excite vibration to the contact portion by applying a voltage to the vibration excitation element, and the contact determination circuit being configured to determine whether or not the object comes into contact with the contact portion, on the basis of the vibration of the contact portion; and an electrical wire configured to connect the vibration excitation element and the detection circuit, and the electrical wire being covered with a covering material, wherein the vibration excitation element is covered with a potting layer made of resin through a predetermined internal space, and the electrical wire includes one end connected to the vibration excitation element while the electrical wire is inserted into the potting layer, and an insertion portion of the electrical wire inserted into the potting layer includes a non-covering portion formed by peeling of the covering material.

According to the invention thus constituted, for example, even when an air pressure difference or the like is generated between a predetermined internal space side where the vibration excitation element and the contact portion vibrate, and the space (external space) outside the potting layer by the using situation of the water handling equipment, or temperature change due to ambient environment, and moisture and the like outside the potting layer are likely to be drawn in the predetermined internal space, moisture and water droplets outside the potting layer, which come through a surface of the covering material of the electrical wire from a clearance between the potting layer and the surface of the covering material of the electrical wire to enter the predetermined internal space can be isolated by the non-covering portion of the insertion portion of the electrical wire inserted into the potting layer.

Therefore, the vibration excitation element in the internal space can be prevented from being exposed to the moisture and the water droplets, and it is possible to prevent lowering of functionality of the vibration excitation element.

In the present invention, the contact portion of the sensing unit is preferably provided in a part of the faucet apparatus.

According to the invention thus constituted, the contact portion of the sensing unit is provided in the one part of the faucet apparatus, so that for example, when water is made to pass through the faucet apparatus, moisture absorbed in the outside of the potting layer is cooled by the passing water, and dew may be condensed. However, the non-covering portion of the electrical wire inserted into the potting layer can prevent condensed dew from entering the internal space of the vibration excitation element.

Therefore, moisture-proofing can be effectively performed without any increase in the size of a portion of the faucet apparatus provided with the contact portion of the sensing unit, and the size of the internal space where the vibration excitation element is provided.

In the present invention, the non-covering portion of the electrical wire is preferably provided in a middle of the potting layer.

According to the invention thus constituted, the non-covering portion of the electrical wire is preferably provided in the middle of the potting layer, so that strength and anticorrosion of a portion other than the non-covering portion of the electrical wire can be enhanced by the covering material.

In the present invention, the electrical wire is preferably composed of a stranded conductor, and a moisture-proof material is preferably applied to at least a part of the non-covering portion in the insertion portion inserted into the potting layer of the electrical wire.

According to the invention thus constituted, moisture may come through a clearance of the stranded conductors to permeate due to the electrical wire composed of the stranded conductor, and therefore the moisture-proof material is applied to at least the one part of the non-covering portion in the insertion portion inserted into the potting layer of the electrical wire, so that the clearance of the stranded conductors can be filled.

Therefore, it is possible to reliably perform moisture-proofing of the insertion portion of the electrical wire inserted into the potting layer.

In the present invention, the moisture-proof material is preferably composed of solder.

According to the invention thus constituted, the clearance of the stranded conductors of the electrical wire can be easily filled by soldering, and it is possible to easily perform moisture-proofing of the insertion portion of the electrical wire inserted into the potting layer.

The present invention preferably further comprises: a potting receiving portion configured to receive the potting layer, and the potting receiving portion being made of resin; and a sealing member provided between the potting receiving portion and the contact portion, wherein the potting layer is composed of epoxy resin.

According to the invention thus constituted, the potting receiving portion made of relatively hard resin receives the potting layer made of epoxy resin, so that it is possible to perform potting excellent in followability such as thermal contraction and excellent in mutual adhesion.

The present invention is a faucet apparatus configured to switch between spouting and water stop by touch operation, the faucet apparatus comprising: the above mentioned touch detection device; an operating unit including the sensing unit; and an on-off valve configured to open and close on the basis of contact determination of an object to the contact portion of the sensing unit by the touch detection device.

According to the invention thus constituted, it is possible to provide a faucet apparatus capable of preventing moisture and water droplets from staying in the vibration excitation element, and preventing lowering of functionality of the vibration excitation element.

According to the touch detection device of the present invention, and the faucet apparatus including the same, the vibration excitation element can be prevented from being exposed to moisture and water droplets, and lowering of functionality of the vibration excitation element can be prevented.

BRIEF DESCRIPTION OF THE DRAWINGS

FIG. 4 is a diagram illustrating a typical output waveform of a piezo-electric element in a case where a user does not touch the sensing unit, in the touch detection device according to the embodiment of the present invention;

FIG. 5 is a diagram illustrating a typical output waveform of the piezo-electric element in a case where the user touches the sensing unit, in the touch detection device according to the embodiment of the present invention;

FIG. 6 is a main flow illustrating operation of the faucet apparatus including the touch detection device according to the embodiment of the present invention; and FIG. 7 is a time chart illustrating an example of the operation of the faucet apparatus including the touch detection device according to the embodiment of the present invention.

DETAILED DESCRIPTION

Now, a faucet apparatus according to an embodiment of the present invention will be described with reference to the attached drawings.

Herein, in a faucet apparatus 1 of this embodiment, a touch detection device A according to the embodiment of the present invention is incorporated, and this touch detection device A can detect operation of a user to switch between spouting and water stop.

Figure 1:
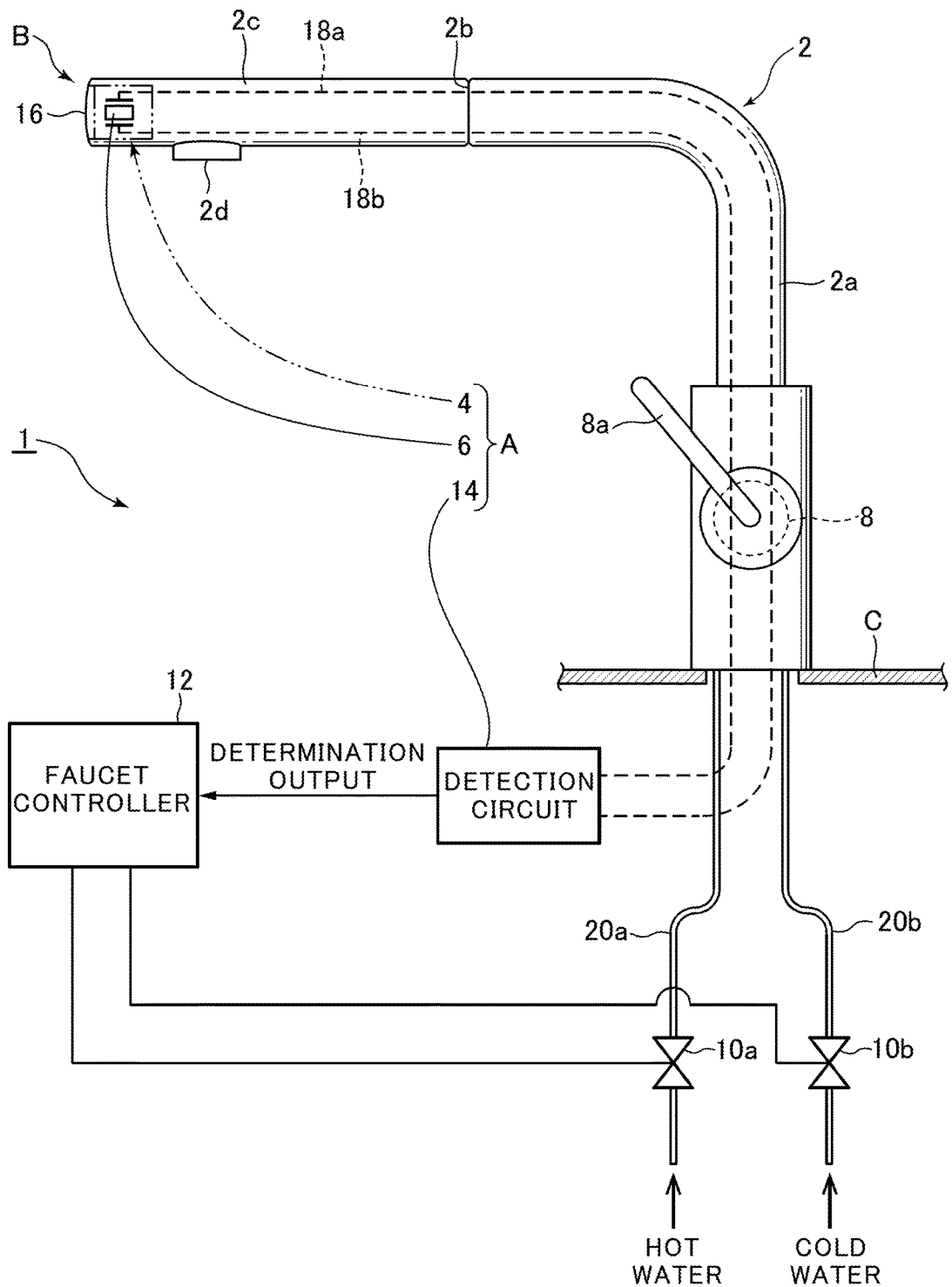
FIG. 1 is a block diagram illustrating schematic configurations of a touch detection device according to an embodiment of the present invention, and a faucet apparatus including the same.
Figure 2:
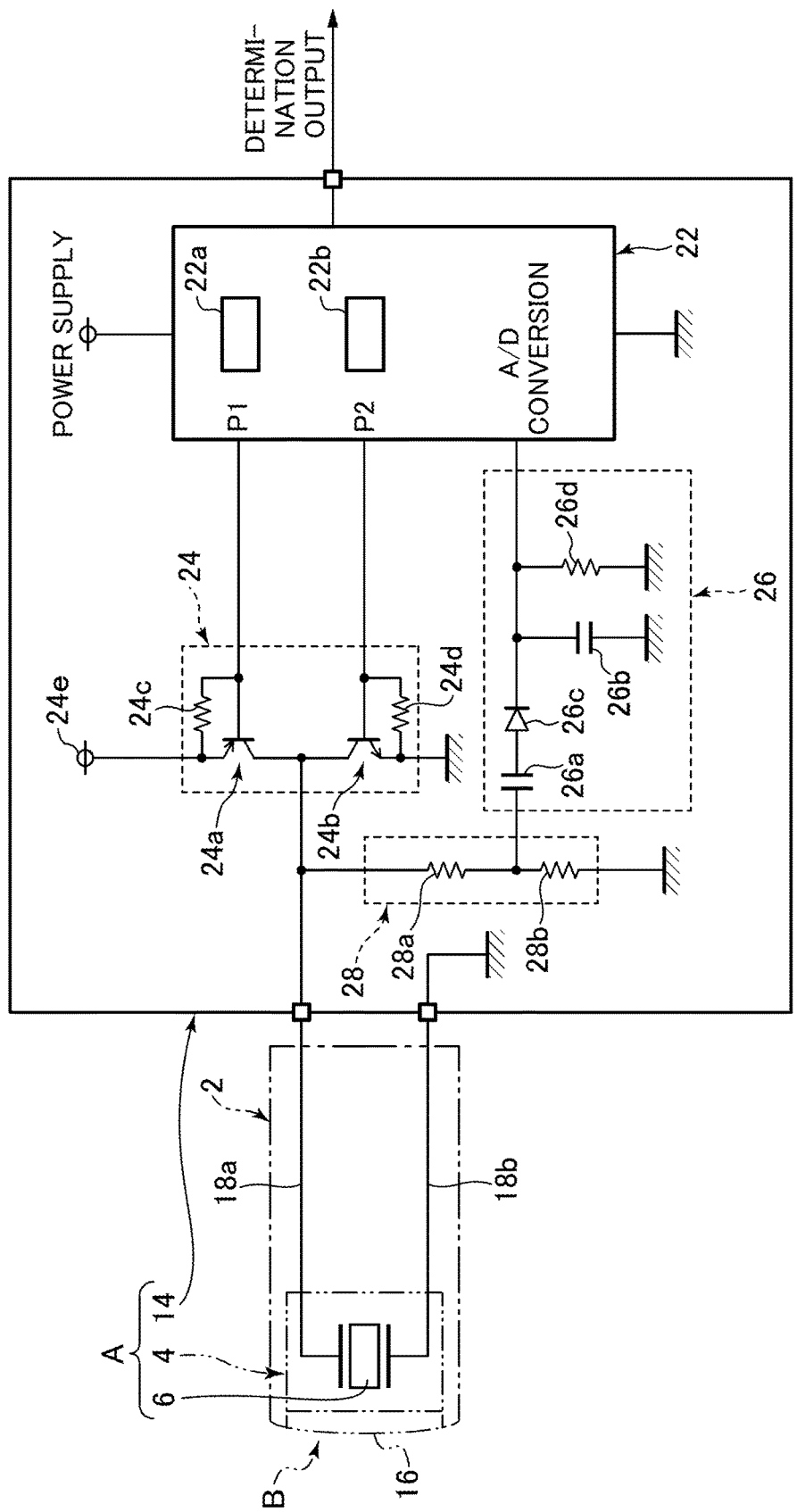
FIG. 2 is a circuit diagram illustrating the schematic configuration of the touch detection device according to the embodiment of the present invention.
Figure 3:
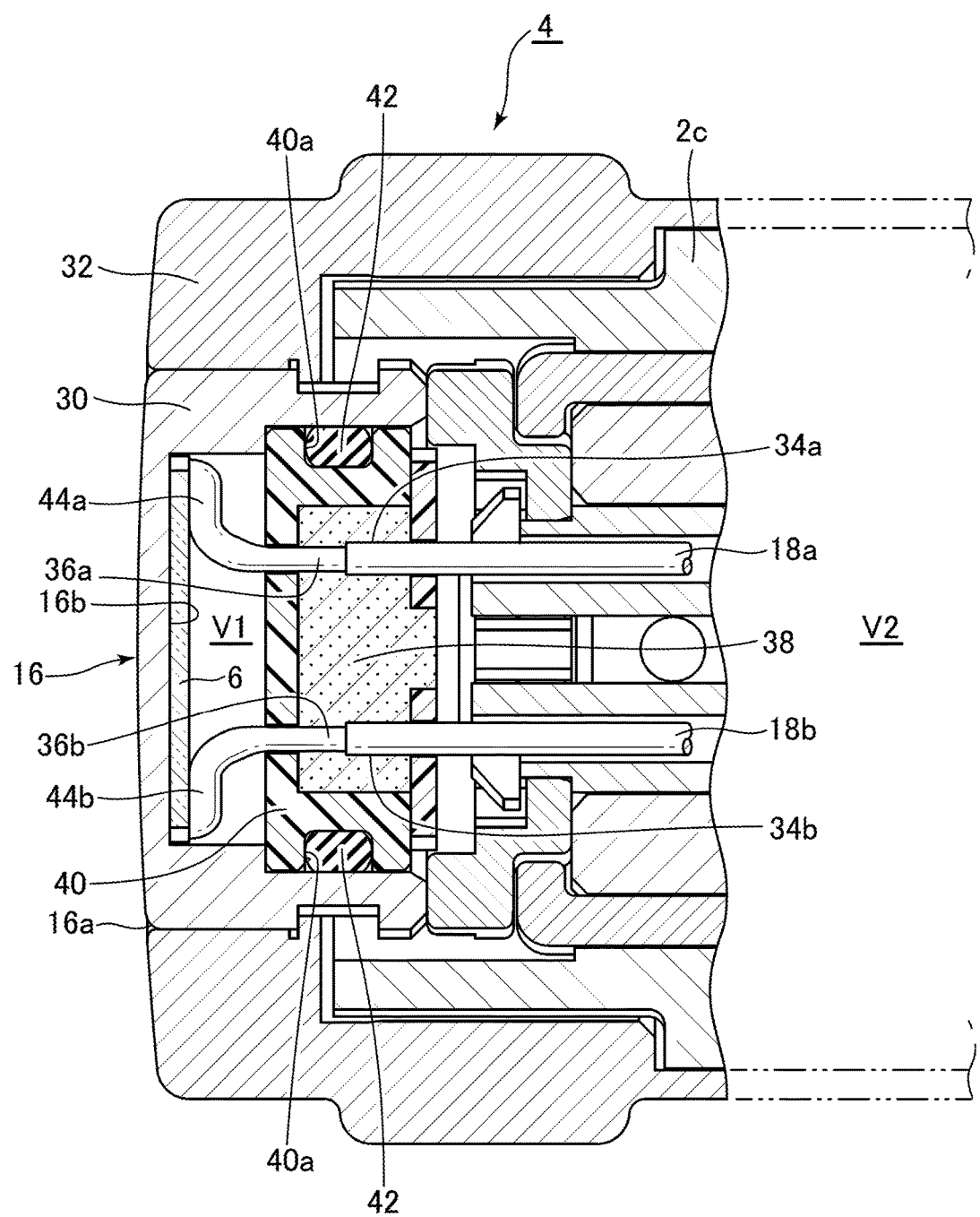
FIG. 3 is an enlarged sectional view illustrating a sensing unit of the touch detection device according to the embodiment of the present invention.

FIG. 1 is a block diagram illustrating schematic configurations of the touch detection device according to the embodiment of the present invention, and the faucet apparatus including the same. FIG. 2 is a circuit diagram illustrating the schematic configuration of the touch detection device according to the embodiment of the present invention. FIG. 3 is an enlarged sectional view illustrating a sensing unit of the touch detection device according to the embodiment of the present invention.

As illustrated in FIG. 1, the faucet apparatus 1 according to the embodiment of the present invention includes a faucet main body 2 mounted on a counter board C, a sensing unit 4 provided in an end portion of this faucet main body 2, a piezo-electric element 6 that is a vibration excitation element mounted on this sensing unit 4, and a hot/cold mixing valve 8 incorporated in a base unit 2a of the faucet main body 2.

Furthermore, the faucet apparatus 1 includes a hot water electromagnetic valve 10a and a cold water electromagnetic valve 10b that are disposed below the counter board C, and are respective on-off valves for switching supply and stop of hot water and cold water, a faucet controller 12 that is a control unit for controlling opening and closing of these electromagnetic valves 10a, 10b, and a detection circuit 14 that transmits a signal to the faucet controller 12 in response to operation to the sensing unit 4.

In the faucet apparatus 1 of this embodiment, the sensing unit 4, the piezo-electric element 6, and the detection circuit 14 constitute the touch detection device A.

In the faucet apparatus 1 of this embodiment, a contact portion 16 of the sensing unit 4 provided in the end portion of the faucet main body 2 is lightly touched by a user, so that each of the hot water electromagnetic valve 10a and the cold water electromagnetic valve 10b is opened and closed, and a water stop state and a spouting state can be switched.

Therefore, in this embodiment, the end portion of the faucet main body 2 provided with the sensing unit 4 functions as an operating unit B for touch operation of the faucet apparatus 1.

As illustrated in FIG. 1, the faucet main body 2 includes the base unit 2a that substantially vertically rises from the counter board C, and thereafter is bent substantially horizontally, and a shower head unit 2c that is a spouting portion detachably provided in an end 2b of this base unit 2a. This shower head unit 2c is a so called pull-out type shower head that can be used in a state of being pulled out to a side close to a user with respect to the base unit 2a, and has an end portion provided with the sensing unit 4.

A spouting port 2d that is a spouting portion is provided in the vicinity of the sensing unit 4 in the shower head unit 2c, and can perform shower spouting from the spouting port 2d.

A form in which the faucet apparatus 1 of this embodiment includes the pull-out type shower head unit 2c detachably mounted on the base unit 2a of the faucet main body 2 as an example is described. However, the present invention is not limited to such a form, and a form in which the base unit 2a to the spouting port 2d of the faucet main body 2 are integrally provided may be employed.

Furthermore, as illustrated in FIG. 1 and FIG. 3, the contact portion 16 of the sensing unit 4 provided in the end of the shower head unit 2c is formed in a curved surface shape in which a central portion of the surface slightly protrudes, and a signal for sensing whether or not an object such as a hand and a finger of a user is in contact with the contact portion 16 of the sensing unit 4 is transmitted to the detection circuit 14.

As described below, the piezo-electric element 6 is incorporated in the sensing unit 4, and this piezo-electric element 6 is electrically connected to the detection circuit 14 by signal lines 18a, 18b that are two electrical wires that pass through the inside of the faucet main body 2.

As illustrated in FIG. 3, the contact portion 16 of the sensing unit 4 having the curved surface shaped surface functions as water droplet guiding means for guiding water droplets toward an outer edge 16a.

Even if a water droplet attaches to the surface of the contact portion 16, such a contact portion 16 of the sensing unit 4 can guide this water droplet to the outside of the outer edge 16a disposed at a lower part along the curved surface shaped surface of the contact portion 16 by gravity to exclude the water droplet, and therefore misdetection by the sensing unit 4 can be prevented without keeping a state where the water droplet attaches to the surface of the contact portion 16.

Additionally, the surface of contact portion 16 of the sensing unit 4 is formed so as to protrude in the curved surface shape, so that when an object such as a hand and a finger of a user comes into contact with the surface of the contact portion 16 in touch operation, contact to the central portion of the curved surface of the contact portion 16 can be urged, vibration of the contact portion 16 can be effectively damped, and therefore it is possible to enhance sensing accuracy of the sensing unit 4.

Furthermore, as illustrated in FIG. 3, in this embodiment, the surface of the contact portion 16 is formed of a material having water-repellent such as electroless Teflon (registered trademark) and nickel plate, and therefore is configured such that a water droplet is likely to roll off to the outside without staying on the surface of the contact portion 16.

The hot/cold mixing valve 8 is incorporated in the base unit 2a of the faucet main body 2, and is connected to a hot water supply pipe 20a connected to a downstream side of the hot water electromagnetic valve 10a, and a cold water supply pipe 20b connected to a downstream side of the cold water electromagnetic valve 10b. Additionally, a hot water adjustment handle 8a is mounted on the hot/cold mixing valve 8, and this hot water adjustment handle 8a is adjusted, so that a mixing ratio of hot water supplied from the hot water supply pipe 20a and a water supplied from the cold water supply pipe 20b is set, and the temperature of hot water discharged from the spouting port 2d can be adjusted. The hot water mixed in the hot/cold mixing valve 8 is guided through a water-passing member (not illustrated) disposed in the faucet main body 2, and is discharged from the spouting port 2d.

The hot water electromagnetic valve 10a and the cold water electromagnetic valve 10b each are an electromagnetic valve that is opened and closed in response to a control signal from the faucet controller 12. The hot water electromagnetic valve 10a is connected to a pipe from a water heater (not illustrated), and flows out hot water to the hot water supply pipe 20a when the valve is opened. The cold water electromagnetic valve 10b is connected to water works, and flows out water to the cold water supply pipe 20b when the valve is opened.

The faucet controller 12 outputs a control signal to the hot water electromagnetic valve 10a and the cold water electromagnetic valve 10b in response to an output signal from the detection circuit 14 to open and close these valves.

The detection circuit 14 is electrically connected to the piezo-electric element 6 incorporated in the sensing unit 4, and outputs a determination output signal to the faucet controller 12.

Additionally, the detection circuit 14 applies an AC voltage to the piezo-electric element 6, so that the piezo-electric element 6 is ultrasonically vibrated at a predetermined frequency, and an output signal is acquired from a terminal of the piezo-electric element 6.

Furthermore, the detection circuit 14 determines whether or not a hand, a finger or the like of a user as an object is touched (comes into contact with) the contact portion 16 of the sensing unit 4, on the basis of the output signal acquired from the piezo-electric element 6, and outputs a determination result as the determination output signal to the faucet controller 12.

More specifically, the faucet controller 12 and the detection circuit 14 are configured by combining a microprocessor or a microcomputer, electronic components such as a semiconductor, a resistor, and a capacitor, and a program for operating a microprocessor and the like.

Additionally, the faucet controller 12 and the detection circuit 14 may be integrally configured by the above electronic components.

Now, a configuration of the detection circuit 14 will be described with reference to FIG. 2.

As illustrated in FIG. 2, a microcomputer 22, a drive circuit 24, a signal conversion circuit 26, and a voltage divider circuit 28 are incorporated in the detection circuit 14.

First, the microcomputer 22 includes a contact determination circuit 22a and a frequency adjustment circuit 22b that function by programs for operating the microcomputer.

Next, the microcomputer 22 controls two transistors 24a, 24b constituting the drive circuit 24, by output signals from two output ports (first output port P1, second output port P2).

Additionally, the microcomputer 22 incorporates an A/D converter circuit that converts a signal of an analog voltage output from the signal conversion circuit 26 into a digital value. Each of the circuits incorporated in the microcomputer 22 performs an operation on the basis of the converted digital value, and determines the presence/absence of a touch to the contact portion 16 of the sensing unit 4.

The drive circuit 24 is composed of a PNP transistor 24a connected to a power supply side, an NPN transistor 24b connected to a ground side, and two resistors 24c, 24d.

First, the PNP transistor 24a has an emitter terminal connected to a power supply 24e, and a base terminal connected to the output port P1 of the microcomputer 22.

Additionally, the resistor 24c is connected between the base and the emitter of the PNP transistor 24a.

On the other hand, the NPN transistor 24b has an emitter terminal connected to a ground, and a base terminal connected to the output port P2 of the microcomputer 22. Additionally, the resistor 24d is connected between the base and the emitter of the NPN transistor 24b.

Furthermore, respective collector terminals of the PNP transistor 24a and the NPN transistor 24b are connected to each other, and are connected to a first electrode (input terminal) of the piezo-electric element 6 through the signal line 18a. Additionally, a second electrode of the piezo-electric element 6 is connected to the ground through the signal line 18b.

The PNP transistor 24a and the NPN transistor 24b are alternately turned on and off in a predetermined cycle by signals from the output ports P1, P2 of the microcomputer 22.

For example, in a state where the PNP transistor 24a is turned on, and the NPN transistor 24b is turned off; a voltage equal to a power supply voltage is output to the signal line 18a.

On the other hand, in a state where the PNP transistor 24a is turned off, and the NPN transistor 24b is turned on, the signal line 18a becomes a ground potential. These states are alternately repeated in the predetermined cycle, so that an AC voltage of a predetermined frequency is applied to the first electrode of the piezo-electric element 6 through the signal line 18a.

Additionally, in a state where an AC voltage is not applied to the piezo-electric element 6, both the transistors 24a, 24b are turned off, each of collectors of the transistors 24a, 24b is in a high impedance state (substantially electrically disconnected state).

In this embodiment, the PNP transistor 24a and the NPN transistor 24b are alternately turned on and off, so that an AC voltage is applied to the piezo-electric element 6. However, an AC voltage may be applied by using an arbitrary switching element such as an FET.

The voltage divider circuit 28 is composed of two resistors 28a, 28b, divides a voltage that appears at a first terminal of the piezo-electric element 6, and adjusts the voltage to a proper voltage.

That is, the resistor 28a has a first terminal connected to the signal line 18a, and a second terminal connected to a first terminal of the resistor 28b.

The second terminal of the resistor 28b is connected to the ground.

Consequently, a voltage that appears at the signal line 18a is divided by a resistance ratio of the resistors 28a, 28b to be adjusted to a proper voltage. As described above, in a state where an AC voltage is applied to the piezo-electric element 6, a power supply voltage and a ground potential alternately appear at the first terminal (signal line 18a) of the piezo-electric element 6 in the predetermined cycle.

On the other hand, in a state where output of the drive circuit 24 is high impedance (both the transistors 24a, 24b are in off states), electromotive force generated by the piezo-electric element 6 appears in the signal line 18*a*.

The voltage divider circuit 28 divides these voltages to output the divided voltages to the signal conversion circuit 26.

That is, a terminal connected to the first electrode of the piezo-electric element 6 functions as an input terminal for applying an AC voltage, and acquires an output signal of the piezo-electric element 6 from this input terminal.

The signal conversion circuit 26 is composed of two capacitors 26*a*, 26*b*, a diode 26*c*, and a resistor 26*d*.

The capacitor 26*a* has a first terminal connected to a connecting point of the resistors 28*a*, 28*b* of the voltage divider circuit 28, and a second terminal connected to an anode terminal of the diode 26*c*.

Furthermore, the diode 26*c* has a cathode terminal connected to an input terminal of an A/D converter incorporated in the microcomputer 22.

Additionally, cathode terminals of the diode 26*c* are connected to the ground through the capacitor 26*b* and the resistor 26*d*, respectively.

Consequently, in an output signal from the voltage divider circuit 28, a DC component is removed by the capacitor 26*a*, a signal obtained by removing the DC component is detected by the diode 26*c*, and a high frequency component is cut by the capacitor 26*b*, and is input to the A/D converter of the microcomputer 22.

Now, details of the sensing unit 4 will be described with reference to FIG. 2 and FIG. 3.

As illustrated in FIG. 3, the sensing unit 4 is made of a metal member mounted on the end of the shower head unit 2*c* of the faucet main body 2, and forms external appearance of the faucet apparatus 1 together with the faucet main body 2.

The sensing unit 4 includes the contact portion 16 that is touched with a hand, a finger, or the like of a user, and a cylindrical portion 30 that extends in the axial direction (to the rear side) from a rear surface 16*b* of this contact portion 16, and is mounted with the piezo-electric element 6 in this cylindrical portion 30.

Herein, the rear surface 16*b* of the contact portion 16 is formed to be a flat surface, and is mounted with the piezo-electric element 6 on this flat surface, and therefore the piezo-electric element 6 and the flat surface of the rear surface 16*b* of the contact portion 16 can be easily adhered to each other.

Furthermore, the sensing unit 4 includes a holding member 32 that is a holding portion provided outside the end portion of the shower head unit 2*c* of the faucet main body 2, and holding an outer peripheral surface of the cylindrical portion 30.

This holding member 32 is made of a metal material such as brass and stainless steel similarly to the contact portion 16, and is larger than a whole of the contact portion 16, and therefore can cover an outer peripheral surface of the cylindrical portion 30 of the contact portion 16 by a thick ring shape less likely to propagate vibration.

Consequently, even when ultrasonic vibration transmitted from the piezo-electric element 6 to the rear surface 16*b* of the contact portion 16 is propagated from the outer peripheral surface of the cylindrical portion 30 of the contact portion 16 to the holding member 32, this holding member 32 functions as vibration propagating means for suppressing vibration propagation toward the outside.

Furthermore, the holding member 32 as such vibration propagating means can effectively suppress propagation of vibration from the periphery of the cylindrical portion 30 of the contact portion 16 to the outside of the holding member 32, and therefore a range in which contact with an object such as a hand and a finger of a user is sensed during touch operation can be limited to the surface of the contact portion 16, and it is possible to prevent misdetection of sensing contact with a part other than the surface of the contact portion 16 by the sensing unit 4.

In this embodiment, the piezo-electric element 6 is a disk-shaped element using piezoelectric ceramic such as barium titanate and zircon titanate, and respective electrodes are provided on both surfaces of this piezoelectric ceramic. An AC voltage is applied between these electrodes through the signal lines 18*a*, 18*b*, so that the piezo-electric element 6 repeats deformation so as to bend as a whole to vibrate.

The piezo-electric element 6 is fixed to the rear surface of the contact portion 16 of the sensing unit 4 with an adhesive, and therefore the piezo-electric element 6 and the rear surface 16*b* of the contact portion 16 are integrated to perform bending vibration.

That is, an AC voltage of a predetermined frequency is applied to the piezo-electric element 6, so that the sensing unit 4 performs bending vibration at amplitude of about several μm.

On the contrary, when the piezo-electric element 6 performs bending vibration, electromotive force generates between the electrodes (signal lines 18*a*, 18*b*). In this embodiment, the frequency of the AC voltage to be applied is set to about 40 kHz that is resonance frequency when the piezo-electric element 6 and the rear surface 16*b* of the contact portion 16 are integrated to perform bending vibration. Preferably, the resonance frequency is set to an ultrasonic wave band of about 20 kHz to about 60 kHz.

As illustrated in FIG. 3, inner parts of the signal lines 18*a*, 18*b* which are electrical wires connecting the piezo-electric element 6 and the detection circuit 14 are each composed of a stranded conductor obtained by twisting a plurality of metal fine wires such as copper, copper alloy, and aluminum.

As illustrated in FIG. 3, basically, in the signal lines 18*a*, 18*b*, respective outer peripheries of bundles of the stranded conductors are covering portions covered by covering materials 34*a*, 34*b* such as polyvinyl chloride or polyethylene. However, as described below, portions on sides connected to the piezo-electric element 6 inside the sensing unit 4 are non-covering portions 36*a*, 36*b* obtained by peeling the covering materials 34*a*, 34*b*, respectively.

Furthermore, as illustrated in FIG. 3, the rear surface side of the piezo-electric element 6 is potted with resin through a predetermined internal space V1, and, more specifically, is covered with a potting receiving member 40 which is a potting receiving portion receiving a potting layer 38 made of epoxy resin. Consequently, in the piezo-electric element 6, the predetermined internal space V1 is secured on the side of the rear surface 16*b* of the contact portion 16, and is partitioned from an external space V2 on the outside (rear surface side) of the potting layer 38 by the potting layer 38 and the potting receiving member 40.

As illustrated in FIG. 3, the potting receiving member 40 receiving the potting layer 38 is made of relatively hard resin, more specifically, made of PPS, and is mounted with an O ring 42 as a sealing member in a concave groove 40*a* formed along an outer peripheral surface of this potting receiving member 40. This O ring 42 seals a space between an inner peripheral surface of the cylindrical portion 30 of the contact portion 16 and an outer peripheral surface of the potting receiving member 40.

Furthermore, the potting receiving member 40 made of PPS receives the potting layer 38 made of epoxy resin, so that it is possible to perform potting excellent in followability such as thermal contraction and excellent in mutual adhesion.

Additionally, the potting receiving member 40 is made of PPS which is resin having excellent moisture-proof, and therefore it is possible to isolate exterior moisture and water droplets.

As illustrated in FIG. 3, while being inserted into the potting layer 38, the non-covering portions 36a, 36b of the signal lines 18a, 18b have first ends connected to the piezo-electric element 6.

Furthermore, the insertion portions of the signal lines 18a, 18b being inserted in the potting layer 38 are covered with the covering materials 34a, 34b from the insertion port sides to a middle portion of the potting layer 38, portions on the end sides from the middle portions of the potting layer 38 are the non-covering portions 36a, 36b obtained by peeling the covering materials 34a, 34b.

Consequently, for example, even when an air pressure difference or the like is generated between the predetermined internal space V1 side where the piezo-electric element 6 and the rear surface 16b of the contact portion 16 vibrate, and an space (external space V2) outside the potting layer 38 by a using situation of the faucet apparatus 1, or temperature change due to ambient environment, and moisture and the like outside the potting layer 38 are likely to be drawn in the predetermined internal space V1, moisture and water droplets outside the potting layer 38, which come through respective surfaces of the covering materials 34a, 34b of the signal lines 18a, 18b from slight clearances between the potting layer 38 and the respective surfaces of the covering materials 34a, 34b of the signal lines 18a, 18b to enter the predetermined internal space V1 can be isolated by the non-covering portions 36a, 36b of the signal lines 18a, 18b inserted in the potting layer 38.

Therefore, the piezo-electric element 6 in the internal space V1 can be prevented from being exposed to the moisture and the water droplets, and it is possible to prevent lowering of functionality of the piezo-electric element 6.

Furthermore, as illustrated in FIG. 3, the contact portion 16 of the sensing unit 4 is provided in the end portion of the faucet main body 2 of the faucet apparatus 1, so that for example, when water is made to pass through the inside of the faucet main body 2 of the faucet apparatus 1, moisture absorbed in the external space V2 outside the potting layer 38 is cooled by the passing water, and dew may be condensed. However, as a countermeasure, the non-covering portions 36a, 36b are provided on the signal lines 18a, 18b inserted into the potting layer 38, so that dew condensation inside the external space V2 can be prevented from entering the internal space V1 of the piezo-electric element 6.

In addition, moisture-proofing can be effectively performed without any increase in the size of the end portion of the faucet main body 2 of the faucet apparatus 1 provided with the contact portion 16 of the sensing unit 4, and the internal space V1 where the piezo-electric element 6 is provided.

Furthermore, as illustrated in FIG. 3, the signal lines 18a, 18b are provided with the non-covering portions 36a, 36b in the middle of the potting layer 38, and are covered with the covering materials 34a, 34b in the external space V2 outside the potting layer 38, respectively, and therefore strength and anticorrosion as electrical wires are enhanced.

Furthermore, as illustrated in FIG. 3, the signal lines 18a, 18b are composed of stranded conductors, as described above, and a moisture-proof material is applied to at least a part of each of the non-covering portions 36a, 36b inserted into the potting layer 38 of the signal lines 18a, 18b.

Herein, as the moisture-proof material, solder, a potting material having low viscosity, or the like is used.

Consequently, even when moisture comes through clearances of the stranded conductors to permeate due to the signal lines 18a, 18b composed of the stranded conductors, the moisture-proof material is applied to at least a part of each of the non-covering portions 36a, 36b of the signal lines 18a, 18b inserted into the potting layer 38, so that the clearances of the stranded conductors can be filled, and it is possible to simply and reliably perform moisture-proofing of the insertion portions of the signal lines 18a, 18b inserted into the potting layer 38.

Additionally, connecting portions 44a, 44b of the signal lines 18a, 18b connected to the rear surface of the piezo-electric element 6 are connected by solder that is a moisture-proof material.

Now, a detection principle in the touch detection device A of the faucet apparatus according to the embodiment of the present invention will be described with reference to FIG. 4 and FIG. 5.

FIG. 4 illustrates a typical output waveform of the piezo-electric element 6 in a case where a user does not touch the sensing unit 4, in the touch detection device of the faucet apparatus according to the embodiment of the present invention, and FIG. 5 illustrates a typical output waveform of the piezo-electric element 6 in a case where the user touches the sensing unit 4.

FIG. 4 and FIG. 5 each illustrate an output voltage waveform from the output ports P1, P2 (FIG. 2) of the microcomputer 22 in an upper part, an output voltage waveform (voltage waveform between the signal lines 18a, 18b) of the piezo-electric element 6 in a middle part, and an output voltage waveform (A/D converter input waveform of the microcomputer 22) from the signal conversion circuit 26 in a lower part.

FIG. 4, FIG. 5, and the like each schematically illustrate a signal waveform, and are different from an actual waveform such as the number of waves output during application of an AC voltage.

First, at time t1 of FIG. 4, application of an AC voltage to the piezo-electric element 6 is started. That is, as illustrated in the upper part of FIG. 4, a voltage pulse alternately outputs to the output ports P1, P2 of the microcomputer 22, so that the PNP transistor 24a and the NPN transistor 24b of the drive circuit 24 (FIG. 2) are alternately turned on. Consequently, as illustrated in the middle part of FIG. 4, a pulse-like AC voltage is applied between both the electrodes (between the signal lines 18a, 18b) of the piezo-electric element 6.

By the application of this AC voltage, the piezo-electric element 6 performs bending vibration. As described above, the frequency of the AC voltage applied to the piezo-electric element 6 is set to coincide with the resonance frequency of the rear surface 16b of the contact portion 16 of the sensing unit 4 and the piezo-electric element 6 that are integrated to vibrate. Therefore, amplitude of bending vibration of the rear surface 16b of the contact portion 16 of the sensing unit 4 and the piezo-electric element 6 by application of the AC voltage is about several μm, and is larger than amplitude in a case where vibration is excited with other frequency.

During the application of the AC voltage, a terminal (signal line 18a) of the piezo-electric element 6 is connected to any of the power supply voltage or the ground by the PNP transistor 24a or the NPN transistor 24b, and therefore a voltage between the electrodes of the piezo-electric element 6 (middle part of FIG. 4) is controlled by these (electromotive force generated by bending vibration of the piezo-electric element 6 is not represented).

Next, at time t2 of FIG. 4, the application of the AC voltage to the piezo-electric element 6 is stopped. When the application of the AC voltage is stopped, both the PNP transistor 24a and the NPN transistor 24b of the drive circuit 24 are turned off, and output of the drive circuit 24 becomes high impedance (comes into electrically isolated state).

On the other hand, the rear surface 16b of the contact portion 16 of the sensing unit 4 and the piezo-electric element 6 performs bending vibration at the resonance frequency by excitation of vibration for time t1 to t2, and after the application of the AC voltage is stopped at time t2, this vibration remains (this phenomenon is generally referred to as "reverberation"), and gradually damps (vibration amplitude is decreased).

After the stop of the application of the AC voltage, output of the drive circuit 24 is high impedance, and therefore electromotive force generated by the bending vibration of the piezo-electric element 6 is represented between both the terminals of the piezo-electric element 6 (between the signal lines 18a, 18b) (from time t2 in the middle part of FIG. 4).

The touch detection device A of the faucet apparatus 1 according to the embodiment of the present invention determines the presence/absence of the touch operation to the sensing unit 4 on the basis of the magnitude of "reverberation vibration" that remains in the sensing unit 4 (and the piezo-electric element 6) after the stop of the application of the AC voltage.

Herein, as illustrated in the middle part of FIG. 4, in a case where the touch operation to the contact portion 16 of the sensing unit 4 is not performed, voltage amplitude after time t2 when the application of the AC voltage is stopped is large, and time until the vibration damps is also increased.

On the other hand, as illustrated in the middle part of FIG. 5, in a case where the touch operation to the contact portion 16 of the sensing unit 4 is performed (a hand, a finger, or the like of a user is in contact with the contact portion 16 of the sensing unit 4), voltage amplitude after time t2 is small, and the vibration also damps in a short time.

That is, in a case where a hand, a finger, or the like of a user is in contact with the contact portion 16 of the sensing unit 4, it is considered that vibration of the sensing unit 4 is absorbed by the hand, the finger, or the like which is in contact with the contact portion 16, and the "reverberation vibration" which remains after the application stop of the AC voltage is decreased.

In this embodiment, DC components of the voltage waveforms of the piezo-electric element 6 illustrated in the middle parts of FIG. 4 and FIG. 5 are removed, and the presence/absence of a touch is determined on the basis of the output waveforms (lower parts of FIG. 4 and FIG. 5) of the signal conversion circuit 26 that has been detected.

More specifically, in this embodiment, the presence/absence of a touch is determined on the basis of the size of an area surrounded by the output waveform of the signal conversion circuit 26 after time t2 (areas of hatched portions of the lower parts of FIG. 4 and FIG. 5. The area is in proportion to vibration energy of the sensing unit 4 and the piezo-electric element 6 after excitation stop).

Now, operation of the faucet apparatus 1 according to the embodiment of the present invention will be described with reference to FIG. 6 and FIG. 7.

FIG. 6 is a main flow illustrating the operation of the faucet apparatus 1 of this embodiment, and FIG. 7 is a time chart illustrating an example of the operation of the faucet apparatus of this embodiment.

The time chart of FIG. 7 illustrates an output voltage waveform from the output ports P1, P2 at the first stage, an output voltage waveform of the piezo-electric element 6 at the second stage, and an output voltage waveform from the signal conversion circuit 26 at the third stage, similarly to the time charts of FIG. 4 and FIG. 5, and illustrates determination output that outputs from the detection circuit 14 to the faucet controller 12 at a lowermost stage.

Processes in a flowchart of FIG. 6 are performed by the microcomputer 22 and a program incorporated in the detection circuit 14.

First, in step S1, frequency adjustment of an AC voltage applied to the piezo-electric element 6 is performed by the frequency adjustment circuit 22b. This frequency adjustment is a process for making the frequency of the AC voltage applied to the piezo-electric element 6 accurately coincide with the resonance frequency of the sensing unit 4 and the piezo-electric element 6, and the process performed by the frequency adjustment circuit 22b is performed when power is supplied to the detection circuit 14, in this embodiment.

More specifically, the frequency of the AC voltage applied to the piezo-electric element 6 from the microcomputer 22 is gradually changed, and the magnitude of the "reverberation vibration" that remains in the sensing unit 4 (and the piezo-electric element 6) after the application stop of the AC voltage (when an operation waveform is FIG. 4, the frequency at which the area of the hatched portion after time t2 in the lower part of FIG. 4) is maximum is selected, so that the frequency adjustment is performed.

As a modification, a switch (not illustrated) for performing frequency adjustment is provided in the detection circuit 14, and the frequency adjustment may be performed by operation of this switch.

In order to sufficiently exert performance of the touch detection device A of the faucet apparatus 1 of this embodiment, the frequency of an AC voltage to be applied sufficiently needs to coincide with the resonance frequency. There is an individual difference in a resonance frequency at which the rear surface 16b of the contact portion 16 of the sensing unit 4 and the piezo-electric element 6 largely vibrate, and the frequency of the AC voltage to be applied is desirably adjusted in response to the faucet main body 2 (the sensing unit 4 and the piezo-electric element 6) combined with the detection circuit 14.

Such a frequency adjustment function is provided, so that it is possible to cope with variation for each individual of the faucet main body 2 to be combined with the detection circuit 14, and it is possible to configure a generic detection circuit 14 capable of being combined with a plurality of type of the faucet main bodies 2.

Then, in step S2 of FIG. 6, a 10 ms timer is reset. In this embodiment, application of an AC voltage to the piezo-electric element 6 is intermittently performed every 10 ms which is a sensing cycle.

In step S2, the 10 ms timer that controls intervals of the application of this AC voltage is reset, and integration of the timer is started. Preferably, the sensing cycle is set to about 10 to 100 ms.

Furthermore, in step S3, a touch detection flow is performed as a subroutine. The touch detection performed in step S3 is performed on the basis of a principle described using FIG. 4 and FIG. 5, and description of a specific process will be omitted. In the example illustrated in FIG. 7, step S3 is performed at time t10, and an AC voltage is applied to the piezo-electric element 6.

In step S4 of FIG. 6, it is determined whether the detection result in step S3 is "touch" or "non-touch". In a case of the "touch", the process advances to step S5. In a case of the "non-touch", the process advances to step S11.

In the example illustrated in FIG. 7, reverberation after excitation (application of the AC voltage) performed for time t10 to t11 is large, and therefore it is determined that the detection result is the "non-touch". In step S11 after the determination of the "non-touch", the process stands by until the timer reaches 10 ms after integration is started in step S2. When 10 ms elapses, the process returns to step S2.

In step S2 of FIG. 6, the 10 ms timer is reset, and integration is started again. In step S3, touch detection is performed again.

In the example illustrated in FIG. 7, step S3 is performed again at time t12 after 10 ms elapses from the start of the previous excitation at time t10.

Furthermore, in the example of FIG. 7, reverberation after stop of the excitation started at time t12 (from time t13) is small, and therefore it is determined that the detection result in step S3 is the "touch". In a case where it is determined in step S3 that the detection result is the "touch", the process advances from step S4 to step S5.

In step S5 of FIG. 6, it is determined whether or not the detection result in step S3 is changed from the "non-touch" to the "touch".

In the example of FIG. 7, the previous detection result started at time t10 is the "non-touch", and the present detection result started at time t12 is the "touch", and therefore the process advances to step S6.

In step S6 of FIG. 6, a flowchart of "touch confirmation detection" is performed as a subroutine, although specific description is omitted. This "touch confirmation detection" is a process performed in a case where the detection result in step S3 is changed from the "non-touch" to the "touch", in order to prevent misdetection by the "touch detection" in step S3.

More specifically, the "touch confirmation detection" is operation similar to the "touch detection", and repeats the same "touch detection" operation at short timing to prevent malfunction due to accidental noise.

In the example of FIG. 7, at time t14 right after the "touch detection" in step S3 is terminated, the "touch confirmation detection" is started.

In step S7 of FIG. 6, it is determined whether or not the result of the "touch confirmation detection" is the "touch". In a case of the "non-touch", there is a high possibility that detection of the "touch" in step S3 is misdetection, and therefore the process advances to step S11 without opening and closing the electromagnetic valve, and stands by until 10 ms elapses from time t12. On the other hand, in a case where the result of the "touch confirmation detection" is the "touch", the determination of the "touch" is settled, and the process advances to step S8.

In step S8 of FIG. 6, it is determined whether or not the faucet apparatus 1 is in a spouting state. In a case where the faucet apparatus 1 is in the spouting state, the process advances to step S10. In a case where the faucet apparatus 1 is not in the spouting state, the process advances to step S9.

In step S10, the contact portion 16 of the sensing unit 4 is newly touched in the spouting state (time t12), and therefore the hot water electromagnetic valve 10a and the cold water electromagnetic valve 10b are closed, and the spouting state is switched to a water stop state.

More specifically, when the detection of the "touch" is settled in the detection circuit 14, a signal representing the "touch settlement" is output from the detection circuit 14 to the faucet controller 12, and the faucet controller 12 sends a control signal to each of the hot water electromagnetic valve 10a and the cold water electromagnetic valve 10b to close these valves.

On the other hand, in step S9, the contact portion 16 of the sensing unit 4 is newly touched in the water stop state (time t12), and therefore the hot water electromagnetic valve 10a and the cold water electromagnetic valve 10b are opened to be switched to the spouting state.

In the example illustrated in FIG. 7, the detection of the "touch" is settled by the touch configuration detection in step S6 started at time t14, and determination output indicating that the detection of the "touch" at time t15 is settled is output to the faucet controller 12.

Thus, even in a case where the "touch" to the contact portion 16 of the sensing unit 4 is detected, the touch detection in step S3 is performed at equal intervals for each 10 ms which is a predetermined sensing cycle.

That is, in the example illustrated in FIG. 7, at time t16 after 10 ms from time t12, step S3 is performed. Reverberation remains small in touch detection performed at time t16, and the contact portion 16 of the sensing unit 4 is kept being touched, and therefore processes in the flow of FIG. 6 is performed in order of steps S3→S4→S5→S12.

In step S12 of FIG. 6, a continuation time of the state of the "touch" is measured. More specifically, an elapsed time after the determination of the "touch" is settled at time t15 of FIG. 7 is measured.

In step S13 of FIG. 6, it is determined whether or not a touch continuation time measured in step S12 exceeds 1 minute. In a case where the touch continuation time does not exceed 1 minute, the process advances to step S11, and processes of step S11→S2→S3→S4→S5→S12→S13→S11 are repeated while a user touches the contact portion 16 of the sensing unit 4.

On the other hand, in a case where the touch continuation time exceeds 1 minute, the process advances to step S13→S10, and the hot water electromagnetic valve 10a and the cold water electromagnetic valve 10b are closed regardless of the state of the faucet apparatus 1.

That is, the touch to the contact portion 16 of the sensing unit 4 over 1 minute by the user is abnormal operation, and there is a high possibility of misdetection of the touch, or failure. Therefore, the hot water electromagnetic valve 10a and the cold water electromagnetic valve 10b are closed regardless of the state of the faucet apparatus 1, and waste of water is prevented.

Furthermore, when the "non-touch" is detected in the touch detection in step S3 performed at time t17 of FIG. 7, it is recognized that the user separates his hand or finger from the contact portion 16 of the sensing unit 4, and the determination output from the detection circuit 14 is changed to the "non-touch" (time t18).

However, the faucet apparatus 1 is kept in the state switched at time t15 of FIG. 7 (the spouting state or the water stop state). After time t18, the processes of step S3→S4→S11→S2→S3 are repeated in the flow of FIG. 6 until the contact portion 16 of the sensing unit 4 is touched again by the user.

Thereafter, in a case where the user touches the contact portion 16 of the sensing unit 4 again, and this touch is confirmed, the processes are performed in order of step S3→S4→S5→S6→S7→S8 in the flow of FIG. 6, and the state of the faucet apparatus 1 is switched (returns to the state before time t15 of FIG. 7). Thus, the state of the faucet apparatus 1 of this embodiment is alternately switched between the spouting state and the water stop state each time when the user touches the contact portion 16 of the sensing unit 4 (operation from the touch of the contact portion 16 of the sensing unit 4 by the user to the separation from the contact portion).

According to the above touch detection device A of the faucet apparatus 1 according to the embodiment of the present invention, for example, even when an air pressure difference or the like is generated between the predetermined internal space V1 side where the piezo-electric element 6 and the contact portion 16 vibrate, and the space (external space) V2 outside the potting layer 38 by the using situation of the faucet apparatus 1, or temperature change due to ambient environment, and moisture and the like outside the potting layer 38 are likely to be drawn in the predetermined internal space V1, moisture and water droplets outside the potting layer 38, which come through respective surfaces of the covering materials 34a, 34b of the signal lines 18a, 18b from slight clearances between the potting layer 38 and the respective surfaces of the covering materials 34a, 34b of the signal lines 18a, 18b to enter the predetermined internal space V1 can be isolated by the non-covering portions 36a, 36b of the insertion portions of the signal lines 18a, 18b inserted in the potting layer 38.

Therefore, the piezo-electric element 6 in the internal space V1 can be prevented from being exposed to the moisture and the water droplets, and it is possible to prevent lowering of functionality of the piezo-electric element 6.

According to the touch detection device A of the faucet apparatus 1 of this embodiment, the contact portion 16 of the sensing unit 4 is provided in a part (the end portion) of the faucet main body 2 of the faucet apparatus 1, so that for example, when water is made to pass through the inside of the faucet main body 2 of the faucet apparatus 1, moisture absorbed in the external space V2 outside the potting layer 38 is cooled by the passing water, and dew may be condensed. Although the moisture absorbed outside the potting layer may be cooled by the passing water to condense dew, the non-covering portions 36a, 36b are provided on the signal lines 18a, 18b inserted into the potting layer 38, so that dew condensation inside the external space V2 can be prevented from entering the internal space V1 of the piezo-electric element 6.

Therefore, moisture-proofing can be effectively performed without any increase in the size of the end portion of the faucet main body 2 of the faucet apparatus 1 provided with the contact portion 16 of the sensing unit 4, and the internal space V1 where the piezo-electric element 6 is provided.

Furthermore, according to the touch detection device A of the faucet apparatus 1 of this embodiment, the non-covering portions 36a, 36b of the signal lines 18a, 18b are provided in the middle of the potting layer 38, and are covered with the covering materials 34a, 34b in the external space V2 outside the potting layer 38, respectively, and therefore strength and anticorrosion of portions other than the non-covering portions 36a, 36b of the signal lines 18a, 18b can be enhanced by the covering materials 34a, 34b.

According to the touch detection device A of the faucet apparatus 1 of this embodiment, even when moisture comes through clearances of the stranded conductors to permeate due to the signal lines 18a, 18b composed of the stranded conductors, the moisture-proof material is applied to at least a part of each of the non-covering portions 36a, 36b of the signal lines 18a, 18b inserted into the potting layer 38, so that the clearances of the stranded conductors can be filled.

Therefore, it is possible to simply and reliably perform moisture-proofing of the non-covering portions 36a, 36b which are the insertion portions of the signal lines 18a, 18b inserted into the potting layer 38.

Furthermore, according to the touch detection device A of the faucet apparatus 1 of this embodiment, the clearances of the stranded conductors of the electrical wires of the signal lines 18a, 18b can be easily filled by soldering, and it is possible to easily perform moisture-proofing of the respective insertion portions (non-covering portions 36a, 36b) of the signal lines 18a, 18b inserted into the potting layer 38.

According to the touch detection device A of the faucet apparatus 1 of this embodiment, the potting receiving portion 40 made of relatively hard resin receives the potting layer 38 made of epoxy resin, so that it is possible to perform potting excellent in followability such as thermal contraction and excellent in mutual adhesion.

Although the present invention has been explained with reference to specific, preferred embodiments, one of ordinary skill in the art will recognize that modifications and improvements can be made while remaining within the scope and spirit of the present invention. The scope of the present invention is determined solely by appended claims.

What is claimed is:

1. A touch detection device for water handling equipment, the touch detection device comprising:
    a sensing unit including a contact portion which includes a contact surface disposed on a front side of the contact portion, the contact surface being configured to come into contact with an object, and the sensing unit being configured to sense contact of the object with the contact surface;
    a vibration excitation element including a piezo-electric element, the piezo-electric element being disposed on a rear surface of the contact portion and being configured to vibrate the contact surface; and
    a detection circuit including a drive circuit and a contact determination circuit, the drive circuit being configured to excite vibration to the contact surface by applying a voltage to the piezo-electric element, and the contact determination circuit being configured to determine whether or not the object comes into contact with the contact surface, on the basis of the vibration of the contact surface; and
    an electrical wire configured to connect the piezo-electric element and the detection circuit, and the electrical wire being covered with a covering material,
    wherein the piezo-electric element is covered with a potting layer made of resin through a predetermined internal space,
    the electrical wire includes one end connected to the piezo-electric element while the electrical wire is inserted into the potting layer, and an insertion portion of the electrical wire inserted into the potting layer includes a non-covering portion formed by peeling of the covering material, and
    wherein the non-covering portion of the electrical wire is provided in a middle of the potting layer with a transition between the electrical wire covered by the covering material and the non-covering portion of the electrical wire is disposed in the middle of the potting layer.

2. The touch detection device according to claim 1, wherein the contact surface of the sensing unit is provided in a part of a faucet apparatus.

3. The touch detection device according to claim 1, wherein the electrical wire is composed of a stranded conductor, and a moisture-proof material is applied to at least a part of the non-covering portion in the insertion portion inserted into the potting layer of the electrical wire.

4. The touch detection device according to claim 3, wherein the moisture-proof material is composed of solder.

5. The touch detection device according to claim 1, further comprising:
- a potting receiving portion configured to receive the potting layer, and the potting receiving portion being made of resin; and
- a sealing member provided between the potting receiving portion and the contact surface, wherein the potting layer is composed of epoxy resin.

6. A faucet apparatus configured to switch between spouting and water stop by touch operation, the faucet apparatus comprising:
- the touch detection device according to claim 1;
- an operating unit including the sensing unit; and
- an on-off valve configured to open and close on the basis of contact determination of an object to the object to the contact surface of the sensing unit by the touch detection device.

* * * * *